United States Patent [19]

Southard

[11] 4,014,238
[45] Mar. 29, 1977

[54] TONE SIGNAL WAVEFORM CONTROL NETWORK FOR MUSICAL INSTRUMENT KEYING SYSTEM

[75] Inventor: James S. Southard, Union, Mich.
[73] Assignee: C.G. Conn, Ltd., Elkhart, Ind.
[22] Filed: June 23, 1975
[21] Appl. No.: 589,370

Related U.S. Application Data

[63] Continuation-in-part of Ser. No. 496,943, Aug. 13, 1974, and a continuation-in-part of Ser. No. 561,970, March 26, 1975, Pat. No. 3,955,460.

[52] U.S. Cl. .................... 84/1.13; 84/1.26; 307/221 C; 323/73; 323/74; 323/80; 323/94 R; 328/75
[51] Int. Cl.² ........................ G10H 1/02
[58] Field of Search ............... 84/1.01, 1.09, 1.1, 84/1.13, 1.24, 1.26, 1.27, DIG. 4, DIG. 5; 307/221 C, 237; 323/73, 74, 79–81, 94 R; 328/37, 75

[56] References Cited

UNITED STATES PATENTS

| | | | |
|---|---|---|---|
| 3,011,132 | 11/1961 | Hinrichs et al. | 323/79 X |
| 3,590,366 | 6/1971 | Vaughn | 323/74 |
| 3,610,805 | 10/1971 | Watson et al. | 84/1.13 |
| 3,610,806 | 10/1971 | Deutsch | 84/1.26 |
| 3,740,450 | 6/1973 | Deutsch | 84/1.24 |
| 3,796,945 | 3/1974 | Feldman et al. | 323/74 |
| 3,819,844 | 6/1974 | Isii | 84/1.26 |
| 3,823,390 | 7/1974 | Tomisawa et al. | 84/1.01 X |
| 3,854,365 | 12/1974 | Tomisawa et al. | 84/1.01 |
| 3,882,751 | 5/1975 | Tomisawa et al. | 84/1.01 |
| 3,903,775 | 9/1975 | Kondo et al. | 84/1.01 |

*Primary Examiner*—Stanley J. Witkowski
*Attorney, Agent, or Firm*—Drummond, Nelson & Ptak

[57] ABSTRACT

A digital keying system for an electronic organ comprises a voltage divider network consisting of weighted value resistors switched into or out of the circuit by corresponding switches. The network is connected to a tone signal output terminal, and a circuit is connected to control the states of conduction of the switches. Closure of a key-operated switch or the presence of a pulse in a predetermined time slot in a digital multiplex signal train causes clock pulses from an attack clock pulse source to be applied to the control circuit to selectively control the operation of the switches to shape the attach waveform of tone signals appearing on the output terminal as determined by the pattern of operation of the switches. Upon release of the key or termination of the pulse in the multiplex signal train, clock pulses from a decay clock generator are applied to the control circuit to operate it in the reverse direction, establishing a decay envelope for the tone signal in accordance with the pattern of operation of the switches. Provisions are made for terminating the application of clock pulses in either direction when a maximum count for that direction has been reached by the control circuit.

13 Claims, 8 Drawing Figures

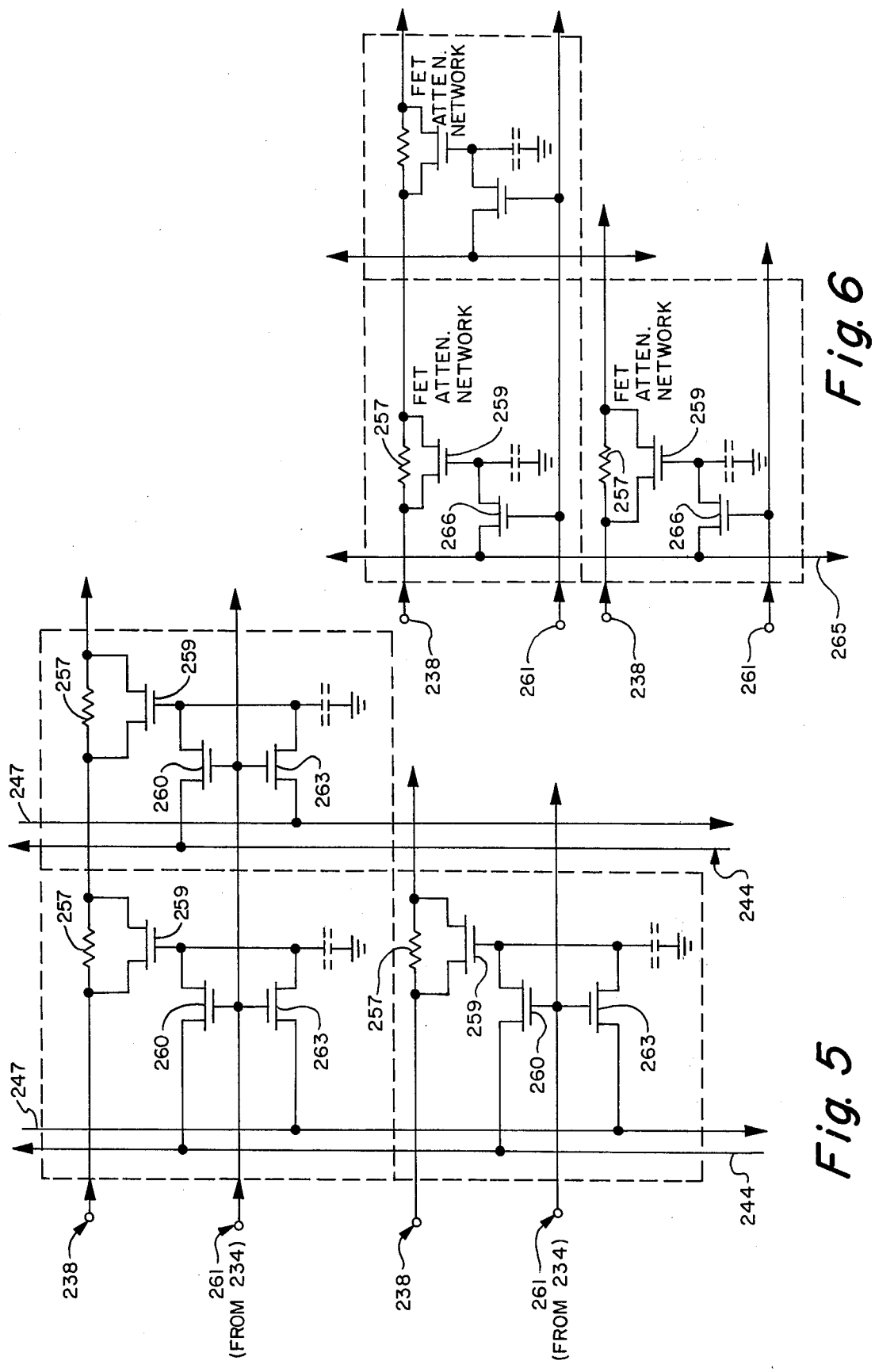

TONE SIGNAL WAVEFORM CONTROL NETWORK FOR MUSICAL INSTRUMENT KEYING SYSTEM

RELATED APPLICATIONS

This application is a continuation-in-part of copending applications Ser. No. 496,943, filed Aug. 13, 1974 and Ser. No. 561,970, filed Mar. 26, 1975, and now U.S. Pat. 3,955,460.

BACKGROUND OF THE INVENTION

In electronic organs and similar electronic tone producing devices of the key actuated type, it has been the practice to employ circuit arrangements for modifying the decay times of tones upon release of a key. This is done to produce percussion effects or to provide natural sounding tone effects representative of other instruments where the termination of a tone signal is not abrupt, but rather decays in amplitude at a rate determined by the particular effect which is being reproduced by the organ. In the past, it has been common to utilize resistive-capacitive (RC) networks for establishing the desired time delays to create such effects. The capacitors in such timing circuits have relatively large values of capacitance, and it has been necessary to use large numbers of such RC circuits corresponding to the number of keyers used in the instrument. Variations in tolerances of such capacitors make it difficult to consistently reproduce the same effects from one instrument to another. Similar difficulty also is encountered within the same instrument in obtaining uniform decay characteristics among the various keys used in the instrument when RC delay circuits are used.

Another disadvantage of the use of such RC timing circuits in electronic musical instruments is that at the present state-of-the-art it is not economically feasible to form large value capacitors as part of integrated circuits. Thus, if integrated circuitry is used for other portions of the logic function of such an electronic instrument, it still is necessary to employ discrete capacitors. This requires additional bonding pads on the integrated circuits reducing the usable chip area and also increases manufacturing costs because of the hybrid nature of the circuitry.

Another problem is encountered when it is desired to vary the RC time constants for the purpose of changing the decay envelope of a tone in response to operation of a key activated control switch. Variable capacitors and variable resistors can be employed to permit adjustments of the time delay characteristics of the RC circuits, but this in turn increases the cost of these components. At the same time, the consistent reproducibility from instrument to instrument and within a given instrument is made increasingly difficult, particularly if resonable costs in the manufacture of the instrument are to be achieved.

In addition, the use of RC timing networks tends to introduce unwanted clicks or pops into the reproduced tones whenever the keys are operated to close and open the switches controlled by the key. These audible noises are distracting, and obviously reduce the quality of the music produced by the instrument.

Accordingly, it is desirable to eliminate, to as great an extent as possible, the RC time delay networks in a musical instrument such as an electronic organ and to replace the time delay functions with other types of attenuator networks which do not require large timing capacitors, which are capable of fabrication in integrated circuit form, and the time delay characteristics of which can be readily varied in accordance with the desires of the designer of the instrument and the musician who plays it.

SUMMARY OF THE INVENTION

Therefore, it is an object of this invention to provide an improved attenuator network for varying the attenuation of signals.

It is another object of this invention to provide an improved keying system for an electronic musical instrument.

It is an additional object of this invention to provide a variable attenuator network for varying the attenuation of signals according to a predetermined pattern and in which the attenuation rate can be easily changed.

It is a further object of this invention to provide a digital keying system for an electronic musical instrument which is adaptable for fabrication in integrated circuit form.

It is yet another object of this invention to provide a digital keyer circuit for an electronic musical instrument and the like in which a variable attenuator network is used in conjunction with a control circuit to shape both the attack and decay portions of the tone output waveform.

It is a still further object of this invention to provide a digital keying system for an electronic musical instrument employing digital multiplexing of the keying information.

It is a yet additional object of this invention to provide an attenuator network for a digital multiplex keyer system in which an attenuator matrix, producing output tones representative of several different keys or notes, includes memory elements which are cyclically refreshed to produce the desired attack, sustain and decay waveforms for the different notes controlled by the matrix.

In accordance with a preferred embodiment of this invention, an attenuator network for varying the attenuation of signals according to a predetermined pattern includes a voltage divider network coupled with the output terminal of a tone signal path to which signals are applied on an input terminal. The voltage divider network includes a number of resistor elements and a corresponding number of switch elements, each of which are connected with a different one of the resistor elements for effectively varying the signal attenuation between the input and output terminals depending upon the state of operation of the switch elements. A counter circuit is operated in response to clock pulses and has several stages, each of which is coupled to control the operation of a different one of the switch elements in accordance with the pattern of output signals obtained from the stages of the counter. Application of clock pulses to the counter circuit is controlled by a key operated control switch.

In more specific versions of the network, the resistor elements have different values of resistance to provide different amounts of attenuation to the signals appearing on the output terminal. The pattern of the resistor values is arranged to conform with the binary output of the counter to cause the attenuation to decrement or increment in an equal DB progression or programmed DB progression.

For control of both attack and decay tone characteristics, a bi-directional reversible binary counter is employed. One source of clock pulses controls the rate of attack of the waveform when a key operated control switch is closed; and another source of clock pulses controls the rate of decay of the waveform when the key-operated control switch is opened. A provision also is made in a specific application of the circuit for pre-establishing an initial attenuation condition and attack shape by an additional attack memory circuit which is activated upon closure of the key operated control switch.

A more specific embodiment of the invention employs a digital attenuator matrix for the twelve notes of an octave used with a demultiplexing circuit for decoding those notes of the octave from a multiplexed serial data stream. The data stream is passed through a shift register; and when the octave is in proper position in the shift register, a strobe pulse is applied to a latching circuit coupled to the outputs of each of the stages of the shift register to store the key data until the application of the next strobe pulse. This key data then is scanned at a relatively high frequency, and the output of the scanner is applied to the digital attenuator matrix which has an attenuator network for each note of the octave. The scanned data also is applied to a control circuit for applying attack, decay and sustain waveform information through a write buffer circuit to continually refresh each attenuator network in accordance with the scanned key data and the condition of the attack, decay or sustain information determined by the control circuit. The outputs of the attenuator networks all are combined together in common to produce the composite tones for the octave controlled by the attenuator matrix and control circuit.

BRIEF DESCRIPTION OF THE DRAWINGS

FIGS. 5 and 6 illustrate variations of circuits which can be used in a portion of the circuit used in FIG. 4;

DETAILED DESCRIPTION

Figure 1:
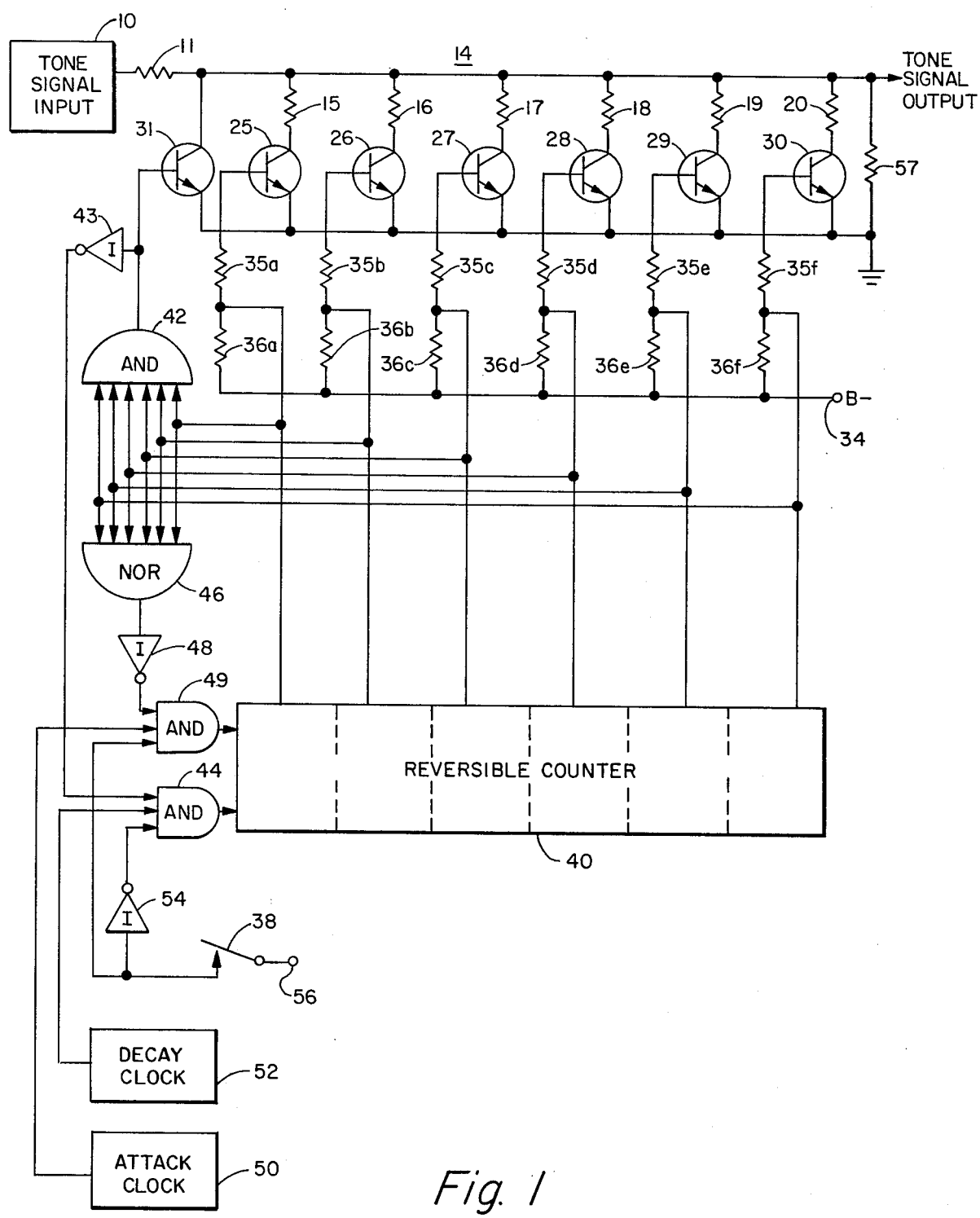
FIG. 1 is a schematic circuit diagram of an embodiment of the invention.
Figure 2:
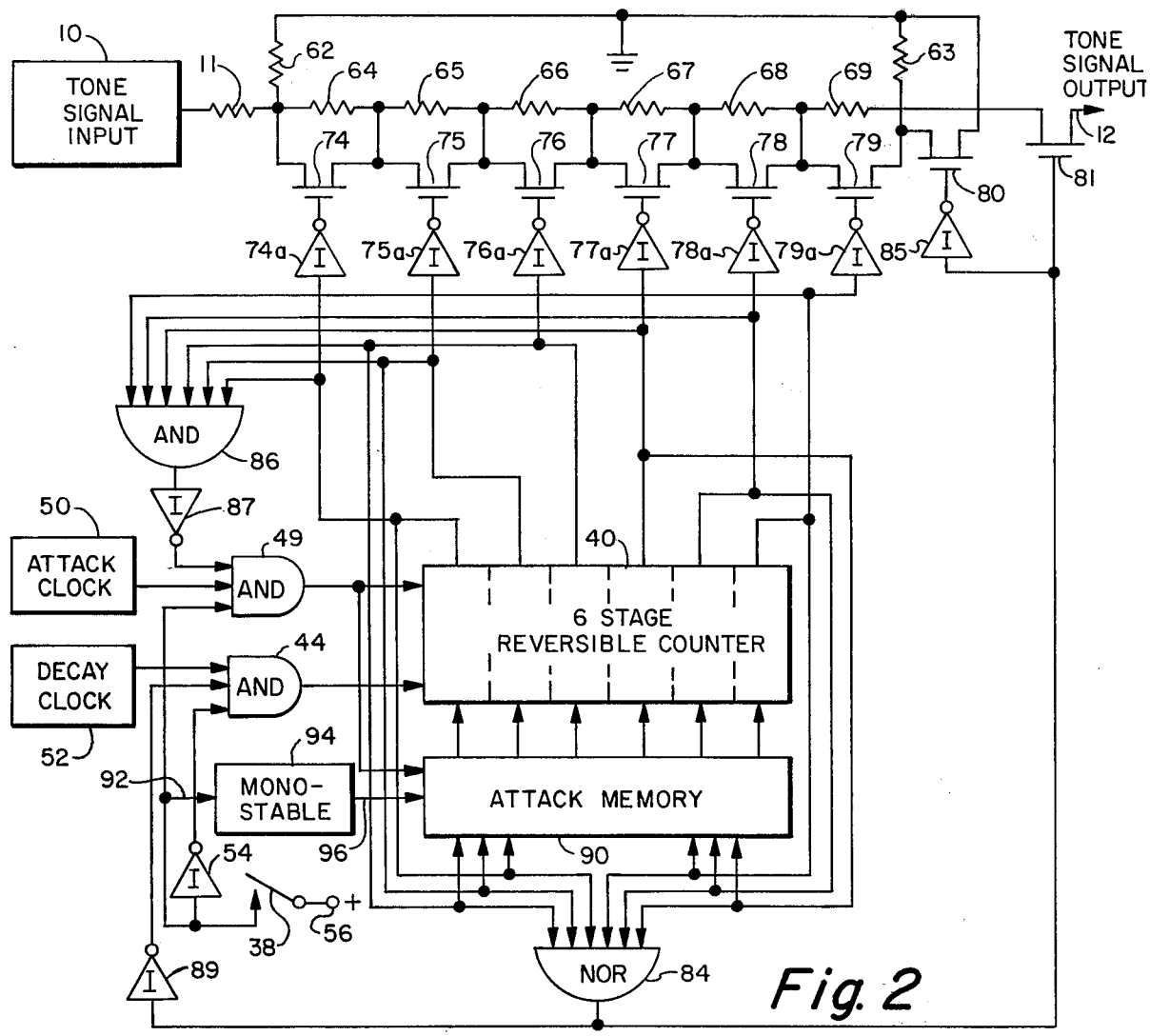
FIG. 2 is a schematic diagram of another embodiment of the invention.

Referring now to the drawings, FIGS. 1 and 2 show digital keyers particularly adapted for use in electronic organs in which a variable attenuator network is operated by depression and release of the organ key to shape the attack and decay envelopes of the tones supplied from a tone generator to the output of the organ. The keyer attack time is controlled by an attack frequency which is generated by an attack clock circuit. Similarly, the decay time of the tone signal output, and the shape of the decay waveform is controlled by a decay frequency which is generated by a decay frequency clock circuit. Different attack and decay frequencies may be chosen for different attack, decay or sustain effects, depending upon the desired characteristics of the tone which is to be reproduced by the system.

A high attack frequency from the attack clock means a fast attack, since it takes less time for the tone signal output to build up from zero or fully attenuated value to its maximum level, at which the tone supplied by the tone signal generator to the output has minimum attenuation. Chiff keyers have the fastest attack in an electronic organ, using a clock frequency of approximately 13.57 kilohertz. A low attack frequency means a slow attack, such as the attack frequencies used for the lowest notes of the flute keyers, typically 430 hertz.

Similarly, different decay frequencies from the decay clock generator are employed depending upon the effect which is to be reproduced. A high decay frequency means that the keyer turns off in a short time, whereas a low decay frequency may stretch out the decay time to several seconds. Generally the chiff, celeste and pulse keyers have fixed decay frequencies provided from the decay clock assemblies which are associated with these keyers. Flute keyers on the other hand, need to be adjustable to follow decay times which are selected by tabs for reverberation, sustain or chime. Typical flute decay frequencies for shaping the decay waveform of the systems shown in FIGS. 1 and 2 have been found to be approximately 800 hertz normally, 108 hertz for reverberation, 27 hertz for sustain, and 13.5 hertz for chime.

The manner in which these attack and decay clock frequencies function with the circuits shown in FIGS. 1 and 2 to provide the desired attack and decay shaping of the tone signal waveforms will be more readily understood in conjunction with the description of operation of the digital keyer attenuator networks shown in these figures.

Referring now particularly to FIG. 1, there is illustrated, partially in block diagram form, an attenuator network and control circuitry for shaping the attack and decay waveforms of the tones produced in a keying circuit for an electronic musical instrument. The tones are generated by a suitable tone signal generator indicated as a tone signal input circuit 10, and these tones are supplied through a coupling resistance 11 to a tone signal output terminal. An attenuator network 14, which is illustrated as a variable parallel voltage divider network, is coupled between ground or a point of reference potential and the output terminal 12 at its junction with the resistor 11.

The divider network 14 of FIG. 1 comprises six resistors 15, 16, 17, 18, 19 and 20, each connected in series with a different NPN transistor switch 25, 26, 27, 28, 29 and 30, respectively. When all of the transistor switches 25 to 30 are nonconductive, the tone signals appearing at the output terminal are at a maximum amplitude level. When one or more of the transistor switches 25 to 30 are conductive, a portion of the tone signals applied through the resistor 11 is shunted to ground through the corresponding resistor 15 to 20 to reduce the amplitude of the signal on the tone signal output terminal. All of the transistors 25 to 30, however, are normally biased nonconductive by the application of a reverse bias direct current potential applied to a terminal 34 which is connected to the bases of each of the transistors through similar coupling resistance networks each consisting of a pair of resistors 35a/36a through 35f/36f, respectively.

Preferably the resistors 15 through 20 are of different weighted values to permit the selective connection of these resistors between ground and the output terminal in accordance with a predetermined binary-weighted pattern to selectively control the attack and decay wave-shapes of the signals on the output terminal.

In the circuit shown in FIG. 1, the conductivity of each of the transistors 25 to 30 is controlled by a different stage of a reversible binary counter 40. The output of each stage of the counter 40 is coupled to the junction of a different one of the pairs of resistors 35a/36a through 35f/36f in the base circuit of the transistors 25 to 30. For example, the first stage of the counter 40 is coupled to the base of the transistor 25 and the last stage is coupled to the base of the transistor 30, with intermediate stages of the counter coupled to corresponding intermediate ones of the transistors 26 to 29. In the quiescent condition of operation when a key-operated switch 38 for the keyer is not operated, the status of the reversible counter 40 of FIG. 1 is such that a high or positive output is obtained from all six stages. This causes all of the transistors 25 to 30 to be forward biased, connecting the shunt resistance paths of all of the resistors 15 to 20 in parallel across the tone signal output terminal. This reduces the tone signal output on the terminal to a point where it is ineffective or cannot be heard. Typically, this is in the range of 70 to 80 decibels down from the maximum level attainable on the terminal.

When the counter 40 is in this state of operation, with a high output obtained from all of its stages, a high output also is obtained from an AND gate 42, having six inputs coupled to the six different outputs of the counter 40. This output is inverted by an inverter 43 to a low output applied to an AND gate 44 which operates to control the counter in its "up" count direction, thereby disabling the AND gate 44 until the count on the counter changes to any other count, at which time the AND gate 44 is enabled. The high output of the AND gate 42 also is applied to the base of an NPN shunting transistor 31 to render it conductive to effectively connect the output terminal to near ground potential. This assures that no tone signals reach the terminal for this "off" condition of the keyer system.

A NOR gate 46 also has six inputs coupled to the outputs of the reversible counter; and since these outputs are high at this time, the output of the NOR gate 46 is low. This output is inverted by an inverter 48 to a high output which is applied to enable a three input AND gate 49 coupled to the "down" count input of the reversible counter 40.

The AND gate 49 is used to apply attack clock counting pulses to the reversible counter from an attack clock generator 50 which operates at the desired frequency of the attack clock pulses to shape the leading or attack part of the waveform when the key 38 is closed.

Similarly, the decay clock wave-shape is controlled by clock pulses generated by a decay clock generator 52 which has its output coupled to one of the three inputs of the AND gate 44. The other two inputs of the AND gates 44 and 49 are connected to the key 38. The input to the AND gate 49 is connected directly to the key 38 and the key input for the AND gate 44 is connected through an inverter 54. Thus, when the key 30 is opened or released, the inverter 54 applies a high or enabling potential to the AND gate 44, while the corresponding input to the AND gate 49 is low, and vice-versa.

When the key 38 is closed with the state of conditions for the counter 40 as described above, that is, all stages producing a high output, the closure of the key 38 applies a positive potential from a suitable source of potential (not shown) on the terminal 56 to enable the AND gate 49 and disable the AND gate 44. Since both enabling inputs to the AND gate 49 are high at this time, the clock pulses produced by the attack clock generator 50 are passed by the AND gate 49 to the "down" input of the reversible counter 40. This causes the counter to commence counting down from its maximum or full count (binary number 63 for a six stage counter) at a rate determined by the frequency of the pulses applied by the attack clock generator 50. This rate can be varied in accordance with the effect which is desired to be produced. For example, as stated previously, for a chiff keyer a relatively high frequency attack clock pulse rate is used, whereas for the lowest notes of the flute keyers a relatively low frequency is employed. The frequency may be selected in accordance with the desired results to be obtained.

As the counter reverses from its maximum count sequentially downward to a count of zero, the six output stages of the counter apply different patterns of high and low outputs to the bases of the corresponding switching transistors 25 to 30. On the very first reverse count of the counter 40 and for all subsequent counts in the reverse direction, the output of the AND gate 42 goes low, reverse biasing the shunting transistor switch 31 to turn it off to remove the ground potential from the tone signal output terminal. At the same time, this low output is inverted by the inverter 43 to a high enabling input for the AND gate 44 to prepare the AND gate 44 to pass the decay clock pulses whenever the key 38 subsequently is released. So long as the key 38 remains closed, however, the inverter 54 applies a low or disabling input to the AND gate 44 so that it is of no consequence in the operation of this circuit during the attack waveform shaping. The output of the NOR gate 46 remains low, since for all counts of the reversible counter 40 except "zero", there is at least one output which is high. This low output is inverted by the inverter 48 to continue to enable the AND gate 49.

The AND gate 49 thus passes the clock pulses continuously until the reversible counter reaches its count of "zero". When this count is attained, the output of the NOR gate 46 then goes high, since all of its inputs are low. This high output is inverted by the inverter 48 to a low output, and the AND gate 49 is disabled to prevent passage of further attack clock pulses to the reversible counter 40. The circuit then remains in this state of operation with all outputs of the counter 40 low, which means that all of the switching transistors 25 to 30 and the transistor 31 are biased to their nonconductive state and the tone signals on the output terminal 12 are at their maximum amplitude. These signals appear across an output load impedance 57.

During the time that the reversible counter 40 is counting down from its highest count to its minimum count, different ones of the resistors 15 through 20 in various combinations are connected in parallel between ground and the tone signal output terminal. Relative values of the resistors 15 to 20 are selected in accordance with binary weighted representations preferably to cause the tone signal output attenuation to be reduced in one decibel steps in direct correspondence with the count in the counter 40. It has been found that the human ear does not detect such one decible steps, and the attack appears to vary to the listener from a point where the tone signal is at maximum attenuation (off) to minimum attenuation (maximum amplitude level) in a continuous manner.

So long as the key 38 remains held down, the tone signal output appearing on the terminal continues at its maximum sustain amplitude. When the key 38 subsequently is released or opened, the enabling potential is removed from the lower input of the AND gate 49, insuring that no pulses are passed by this gate; and the inverter 54 applies an enabling potential to the third input of the AND gate 44. Since the potential from the inverter 43 at this time also is high, the AND gate 44 operates to pass the clock pulses from a decay clock generator 52 to the "up" count input of the reversible counter 40. These pulses establish the decay frequency of the tone signals on the output terminal; and, as with the case of the attack clock pulses, the decay frequency clock generator 52 is selected to produce pulses at a frequency corresponding to the desired decay frequencies. Depending upon the function, these frequencies can be relatively high, which means that the keyer turns off in a short time; or at a relatively low frequency which may stretch out the decay time to several seconds, such as for chime selection of the flute keyers. For keyers associated with chiff and celeste, the decay clock frequencies are typically hard wired, while for the flute keyers different decay clock frequencies may be selected by selection of the reverberation, sustain, or chime tabs of the electronic organ with which the keyer may be used. Selection of these different tabs changes the frequency of the decay clock pulses which are applied by the generator 52.

Irrespective of the frequency of the clock pulses, the operation of the circuit of FIG. 1 is the same. The decay clock pulses cause the reversible counter to count in its "up" direction from a count of zero to its maximum count of 63, the rate being dependent upon the decay clock frequency. As this count is increased, different combinations of the transistor switches 25 to 30 are rendered conductive and nonconductive in accordance with the binary pattern. The binary weighted resistors 15 to 20 thus are correspondingly connected in shunt in different patterns across the tone signal output to progressively change the attenuation of signals on the output terminal 12 in one decibel steps from its maximum level reached when the counter was at its count of zero to a minimum level reached when the counter attains its maximum or full count of 63. When the count of 63 is reached, all inputs to the AND gate 42 become high, and this causes the shunting transistor 31 once again to be rendered conductive to shunt the output terminal to ground. At the same time the inverter 43 applies a low or disabling input to the AND gate 44, preventing the further passage of decay clock pulses to the counter. The system thus is reset to its initial state of operation awaiting the next closure of the key 38, at which time the above cycle of operation will be repeated.

If following closure of the key 38, it is opened before the reversible counter 40 attains its minimum or zero count, the result is to immediately disable the AND gate 49 to prevent further passage of the attack clock pulses through that gate and to enable the AND gate 44 to immediately permit passage of the decay clock pulses to reverse the counter state. As a consequence, the decay of the tone signal output takes place from whatever point is reached on the attack waveform at the time the key 38 is opened.

By using a binary reversible counter 40 and by employing binary weighted relative values of the resistors 15 to 20, very smooth transition in one decibel steps is effected with the circuit of FIG. 1. However, if the large number of steps which are possible with a six stage reversible binary counter 40 are not desired or necessary, it is possible to use a reversible ring counter in place of the counter 40. In such an event the AND gate 42 and NOR gate 46 could be replaced by corresponding direct connections to the first and last stages of the counter to effect the same results. The counter outputs then would cause the switching transistors 25 to 30 to be rendered conductive one at a time in sequence as the count progressed in either the forward or reverse direction through such a counter. With this type of circuit, the resistors 15 to 20 would be arranged with the resistor 20 having a minimum value (for maximum attentuation) and the resistor 15 having a maximum value (for minimum attenuation of the tone signals on the output terminal). The values of the resistors 15 to 20 could be selected to cause the decibel change in the tone signal output for each step to be in accordance with predetermined steps or jumps to produce the desired waveform characteristics. Of course, if such a reversible ring counter is employed, more than six stages would be preferable to permit the desired flexibility of the waveform characteristics, and to prevent the attack or decay waveforms from taking place in such large steps as to produce audible pops or discontinuities in the tone signal output on the terminal. Otherwise, such a circuit would operate in the same manner as the one which is shown in FIG. 1.

Referring now to FIG. 2, there is shown another version of a digital keyer for controlling the attack and decay waveforms in which a series voltage divider circuit is employed instead of the parallel shunt arrangement of FIG. 1. In FIG. 2, the components which are the same or similar to components shown in FIG. 1 are given the same reference numbers as used in conjunction with the description of the circuit shown in FIG. 1. In the circuit of FIG. 2, tone signals from the tone signal input generator 10 are applied through the resistor 11 and through a series attenuator network 62 to 69 and a field-effect transistor (FET) switch 81 to the output terminal. The attenuator network is coupled at each end through resistors 62 and 63 to ground to establish the operating point for the tone signal output appearing on the terminal.

In the quiescent condition of operation, with the key operated switch 38 open and the system in its stable state, all stages of the six stage reversible counter 40 produce a low output (in contrast with the high output of the circuit of FIG. 1 for the same condition). This output is inverted to a high output by inverters 74a to 79a, respectively. In such a condition, all of the series connected attenuator resistances 64, 65, 66, 67, 68 and 69 are effectively connected in series between the junction of the resistor 11 and the resistor 62 and the transistor switch 81, since shunting N-channel P-MOS (p-type substrate) FET switches 74 through 79, each connected across a different one of the resistors 64 to 69, respectively, all are nonconductive. This condition of operation exists when N-channel P-MOS fieldeffect transistors are employed in the circuit since such transistors are rendered conductive by the application of a low or negative potential to their gates and are rendered nonconductive by the application of a high or relatively positive potential to their gates.

All of the stages of the counter 40 are connected to corresponding inputs of a NOR gate 84 which produces a high output when all of the stages of the counter are low. This in turn is inverted by an inverter 85 to forward bias the N-channel FET switch 80 connected across the resistor 63 to apply ground potential to the output end of the divider network 60. At the same time, the output of the NOR gate 84 applies a high potential to the gate of the N-channel FET 81 causing it to be biased to its nonconductive state, effectively applying an open circuit between the end of the divider network and the tone signal output terminal. As a consequence, no tone signals are applied to the output from the tone signal input generator 10.

At the same time, an AND gate 86, which also has inputs connected to each of the stages of the six stage reversible counter 40, has a low potential on its output and this is inverted by an inverter 87 to apply a high enabling input to the AND gate 49. Similarly, the high output of the NOR gate 84 is inverted by an inverter 89 to disable the AND gate 44.

When the key-operated switch 38 is closed, the AND gate 49 passes the attack clock pulses from the clock generator 50 in the same manner described previously in conjunction with FIG. 1. In FIG. 2, however, these pulses are applied to an attack memory 90 and to the up input of the six-stage reversible counter 40 instead of to the down input as described in conjunction with FIG. 1. This is because of the differences in the series and shunt voltage divider networks, so far as signal attenuation is concerned. When all of the transistors 25 to 30 of the circuit of FIG. 1 are conductive, maximum attenuation of the tone signal output was achieved. When all of the transistors 74 to 79 of the circuit of FIG. 2 are conductive, however, minimum attenuation of the tone signal output is achieved, since these transistors act as short circuit shunts between the tone signal input and the tone signal output instead of shunting signals through the resistors to ground. The operation of the circuit of FIG. 2, however, is otherwise similar to the operation of the circuit of FIG. 1, and the resistors 64 to 69 have relative weighted values in accordance with the binary count produced by the counter 40. Preferably, these values are selected to cause one decibel increments of the tone signal output to be achieved by the operation of the circuit in the same manner as described in FIG. 1. In FIG. 2, this is accomplished by shunting out different combinations of the resistors 64 to 69 whenever corresponding ones of the switching FET transistors 74 to 79 are rendered conductive.

The first count applied to the attack memory 90 and the reversible counter 40 causes at least one of the counter outputs to go high, which in turn results in a low output from the NOR gate 84. This reverse biases the shunting transistor 80 and causes the transistor 81 to be rendered conductive. At the same time, the inverter 89 applies a high input to the AND gate 44 to enable it for subsequent operation. However, so long as the switch operated key 38 is held down, the inverter 54 prevents the passage of the decay clock pulses through the AND gate 44.

When the counter 40 reaches its maximum count, all stages high, minimum attenuation of the signals from the tone signal generator is achieved since all of the transistors 74 to 79 are conductive, thereby shunting or short circuiting all of the resistors 65 to 69 in the resistor divider chain. At the same time, the high output from the AND gate 86 is inverted by the inverter 87 to disable the AND gate 49, in a manner similar to that described in conjunction with FIG. 1. No more clock pulses are applied to the counter from either generator 50 or 52 for the remainder of the time this key 38 is held closed.

Upon subsequent release of the key 38, the AND gate 49 remains disabled, due to the low potential applied to it by the key release; but the inverter 54 enables the AND gate 44 to pass the decay clock pulses to the down count input of the reversible counter 40. The counter 40 then reverses direction, causing different binary combinations of the shunting switch transistors 74 to 79 to be rendered conductive to cause the decay of the tone signal output to take place in one decibel steps at a frequency determined by the frequency selected for the decay clock generator 52. To this extent, the operation of the circuit of FIG. 2 is similar to that achieved by the circuit of FIG. 1.

It has been found, however, that the attack waveform need not progress in one-decibel steps, and it also is desirable in many cases to cause the attack to take place in less than the number of steps which are required to advance the counter 40 through its entire count from a minimum to a maximum count in shaping the attack waveform. In the circuit of FIG. 2, the attack waveform may be modified by employing an attack memory circuit 90 which preferably is an ROM (read only memory), is pre-programmed to establish a particular attack waveform sequence. The attack memory 90 has six outputs, each connected to a different one of the stages of the six stage reversible counter. It also includes an input connected to the output side of the key-operated switch 38.

When the key-operated switch 38 initially is closed, a positive potential pulse is applied from the supply terminal 56 through a lead 92 to the input of a monostable multivibrator 94 which applies a pulse on a lead 96 to the attack memory 90. In its simplest form, the attack memory 90 includes pre-wired diode interconnections between the lead 92 and selected ones of the outputs to cause trigger pulses to be applied to selected stages of the counter 40 when the key 38 initially is closed. These inputs reverse the state of those stages to store an initial count in the counter 40. This count, of course, is reflected in the conditions of the outputs of the six stages of the counter 40 and immediately applies a preselected attenuation to the signals applied to the tone signal output terminal. This attenuation is substantially less than that which is applied by the counter 40 when it is set to its minimum or zero count.

Typically, it has been found that this first or initial count can be selected to provide approximately -31 decibels attenuation to the tone signal to start the attack waveform at this point. For the simplest form of the attack memory 90 as described, further operation of the reversible counter 44 for generating the remainder attack waveform takes place in one decibel steps as the counter is advanced by the application of attack clock pulses on the up count input of the counter. There is no affect on the decay operation of the circuit by the attack memory 90.

It is also desirable, in some cases, to further modify the shape of the attack waveform in accordance with the changing states of the six-stage reversible counter.

To accomplish this, each of the six outputs of the reversible counter 40 also are connected to six additional inputs of the attack memory 90. The output conditions of the stages of the reversible counter 40 then are compared in the memory 90 with preset conditions in coincidence gates to cause additional pulses to be selectively applied on the output leads of the attack memory 90 to the individual stages of the reversible counter 40 in response to the pulses from the gate 49. This causes those selected stages to be reset to different stages, modifying the pattern of the attack waveform. This means that increments other than one decible can be obtained in response to individual clock pulses. Once the maximum count is attained by the counter 40, however, the system operates in the same manner described previously; and the attack memory 90 has no effect on the subsequent operation of the attenuator network in its sustain or decay mode.

Figure 3:
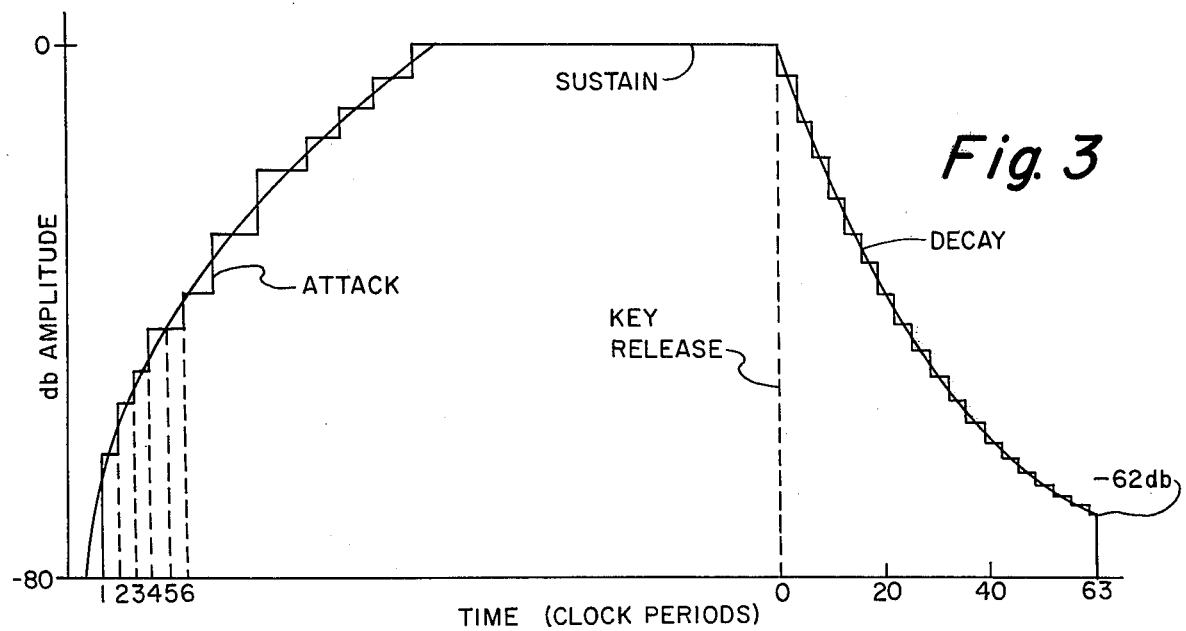
FIG. 3 is a waveform showing a characteristic tone curve obtained in accordance with operation of the embodiment shown in FIG. 2.

In FIG. 3, the waveform characteristics of the operation of the circuit of FIG. 2 are shown in a representative manner. The attack waveform is illustrated as immediately rising to a relatively high intermediate value (typically −31 DB) in response to the application of the first clock pulse. It can be seen that the attack waveform frequency does not necessarily follow one decibel increments, although such increments would be obtained with a simple attack memory which only set the initial condition into the counter 40 and did not continuously monitor and change the state of the counter 40. Once the maximum level (minimum attenuation) condition is reached when the counter 40 is set to its highest count, the tone signal output remains at its sustain level (essentially zero DB attenuation) which is illustrated by the central portion of the waveform in FIG. 3. Upon release of the key, the decay mode of operation takes place, with the attenuation being effected in one decibel increments to reduce the attenuation from zero decibel to −62DB for a six state reversible counter. When the 63rd pulse is counted, all of the outputs of the counter 40 go low, causing the NOR gate 84 to drive the transistor 80 conductive and the transistor 81 nonconductive. This reduces the tone signal output to its open circuit or minimum condition which is set at approximately −80DB. This last drop from −62DB to −80DB in one step, however, is not noticeable due to the extremely low level of the signal which is present at −62DB. This is true even for long decay times such as are used with flute keyers in conjunction with a chime decay frequency of several seconds.

Also, if P-channel FET's were used in the circuit of FIG. 2, the inverted counter outputs would be used and the gate 84 would be an AND gate and the gate 86 would be a NOR gate.

In the circuits shown in FIGS. 1 and 2, the keyer inputs which are used to control the application of tone signals from an input to a tone signal output are indicated simply by the closure of a single-pole, single-throw switch. That simple switch configuration may be expanded for a digital multiplex organ system in which the key and coupler information is contained in a serial data stream generated in accordance with the disclosure of the above-mentioned application Ser. No. 561,970. Such a multiplex keyer may take a number of different forms, but the form of keyer illustrated in FIGS. 4 to 8 provides substantial flexibility in the control of the attack and decay waveforms and permits the effective utilization of MOS integrated circuit techniques.

Figure 4:
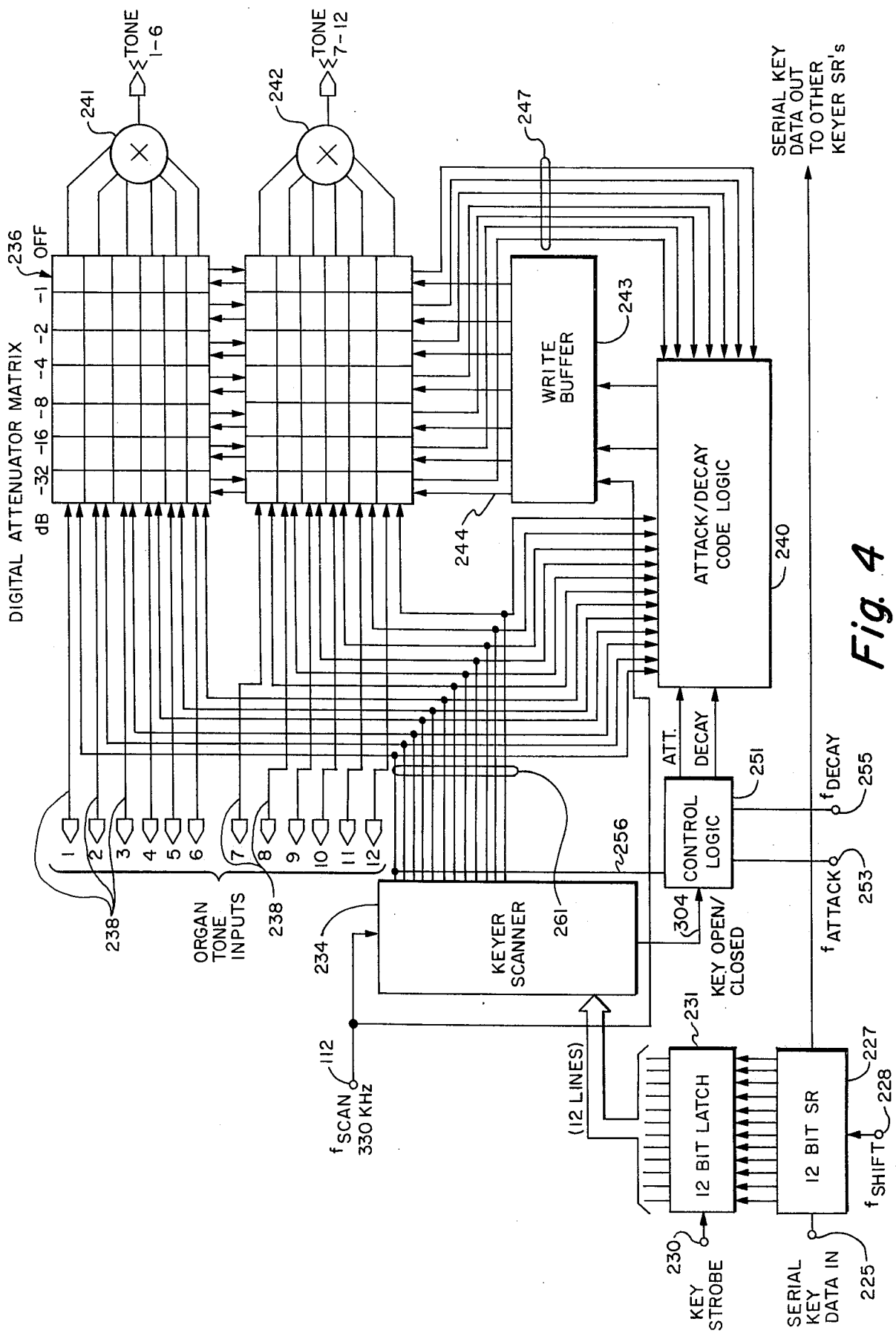
FIG. 4 is a detailed block diagram of another embodiment of the invention used in conjunction with a digital multiplexed serial data stream representative of the keying informaton.

Referring now to FIG. 4, the serial data input to the keyer circuit is applied to an input terminal 225. The keyer is arranged to process the serial multiplexed data in blocks of 12 data pulses, each block of data representative of a different octave of notes. For example, a celeste de-multiplex keyer may include four serial sections of the type shown in FIG. 4, which illustrates the keyer components necessary for de-multiplexing and keying the notes for one octave. Similarly, a flute de-multiplex keyer has additional sections to accommodate the full 85 note capability or capacity of such a keyer.

The serial data input on the lead 225 is supplied to a 12-bit shift register 227 which is supplied with shift pulses on a terminal 228 at the frequency of the multiplexed data (for example, 55 kilohertz) from the output of a system clock. The output of the shift register 227 then is supplied as the input to the next shift register in the keyer, with the number of shift registers depending upon the capacity of the keyer as described previously.

Once the serial key data applied to the terminal 225 is properly aligned or in position to present the octave of notes to be decoded and keyed by the circuit of FIG. 4 inside the shift register 227, a key strobe pulse is applied to an input terminal 230 of a 12-bit or 12-stage binary latching circuit 231. This key strobe pulse applied to the terminal 230 is the strobe pulse described in copending application Ser. No. 561,970 as applied to the keyers 157, 160, 164, 167 and 177 of that application.

The outputs of the latch circuit 231 then represent the key information, and this information is continually renewed or changed in accordance with the sampling provided by the key strobe pulse on the terminal 230. A change occurs in the state of any one of the stages of the latch circuit 231 only when there is a change in the operation of the key or coupler control in the multiplexing system to change the desired note. The 12 outputs from the latch circuit 231 are applied to corresponding inputs of a keyer scanner circuit 234 which consists of 12 OR gates, each one having one input from a different one of the 12 outputs of the latch circuit 231 and each having another input connected to one of the twelve scanning input leads 112. The scanning rate of each of the leads 112 is one-twelfth of a 330 kilohertz scanning clock pulse rate F scan. This causes each of the outputs of the latch circuit 231 to be sequentially and repetitively scanned at one-twelfth the 330 kilohertz scanning clock frequency. The scanning is also connected from the scanner 234 to leads 261 of a digital attenuator matrix 236.

Each horizontal row of the cells of the attenuator matrix 236 includes an attenuator network of the type described in the aforementioned copending application, Ser. No. 496,943. FIGS. 5 and 6 show details of two different arrangements of circuit configurations which may be used for the attenuator cells. The outputs from the keyer scanner circuit 234 comprises a sequence of pulsed outputs, and these outputs are used to continually enable and renew the information in the attenuator matrix cells to permit the passage of the tone signals applied to 12 tone inputs 238 for the octave being decoded.

The keyer scanner 234 also is connected to an attack/decay code logic circuit 240 and circuitry for controlling the operation of the seven attenuator cells in each horizontal row of cells connected in series between each of the tone generator input leads 238 and the corresponding output from the attenuator matrix 236. Six of these outputs are combined in common in a mixer circuit 241, and the other six outputs are combined in a mixer circuit 242. All of the outputs of comparable mixers in all of the octave keying sections of the de-multiplexer keyer circuit are combined together to produce a single composite output from the keyer.

The output of the attack/decay code logic 240 is applied through write buffer amplifier circuits 243 to refresh the attenuator cells. The output leads 244 from the write buffer circuits 243 are each connected in parallel to a different vertical row of the input gates of the cells in the attenuator matrix 236. The state of each of the attenuator stages is read or sampled by seven output leads 247, each of which is connected in parallel to corresponding vertically aligned cells of each of the attenuators for the twelve notes represented by the octave keyer section of FIG. 4.

One of the scanning lines 261, specifically identified as lead 256, along with the information representative of the key operation from the keyer scanner 234, is applied to the control logic circuit 251. The circuit 240 then is supplied with attack and decay signals through the control logic circuit 251, which has a preselected attack frequency applied to an input lead 253 and a preselected decay frequency applied to a lead 255. These frequencies can be fixed for any particular keyer or can be varied, as in the case of the flutes, by adjustment of flute decay tabs to cause different output frequencies to be obtained from a flute decay control circuit and applied to the lead 255.

The control logic circuit 251 applies either an attack pulse, a decay pulse, or neither, depending upon the key open/closed information supplied to it from the key scanner 234 over lead 256 and the present and previous state of both the f attack and f decay frequencies from the start of one keyer scan to the next scan.

Figure 8:
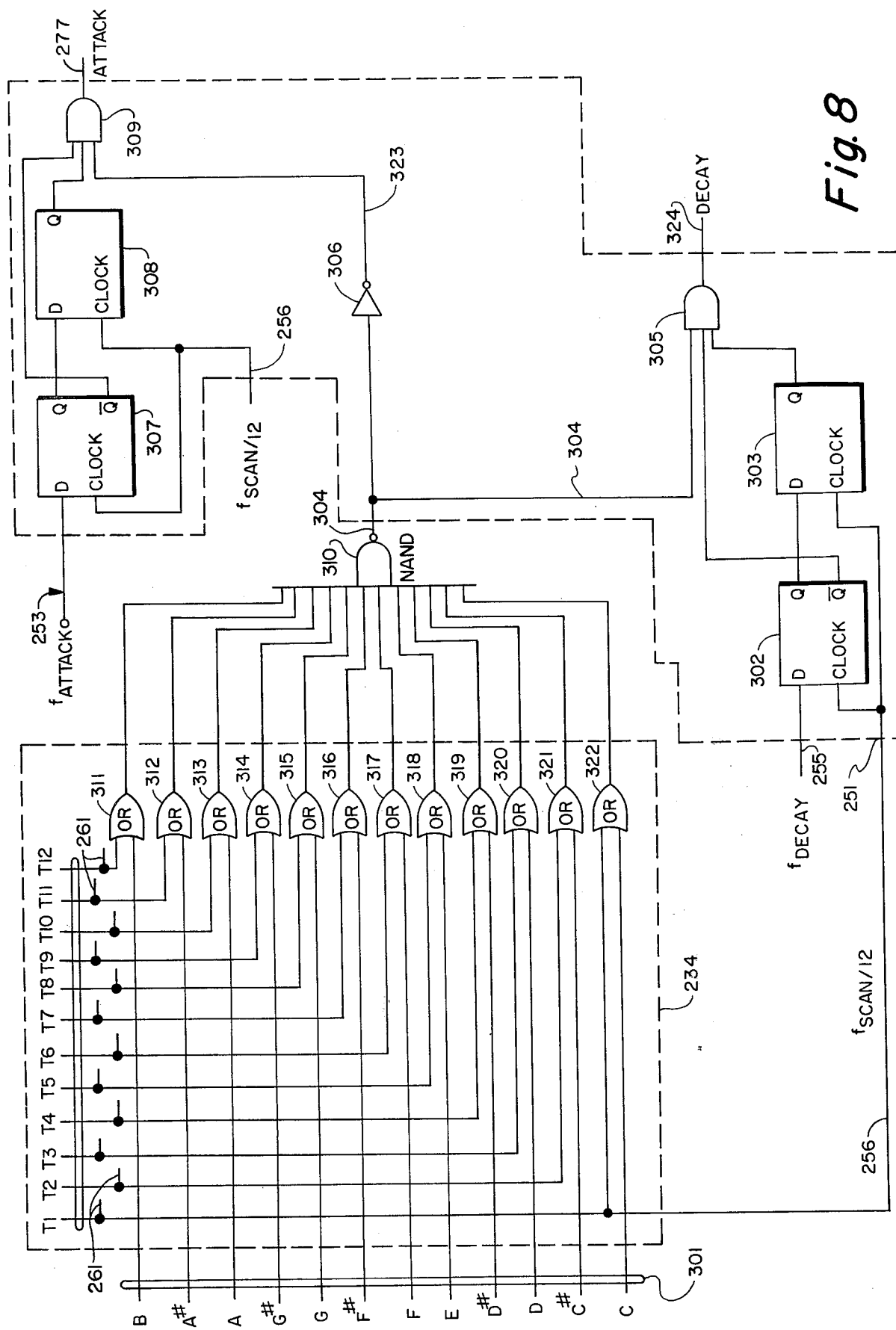
FIG. 8 illustrates details of another portion of the circuit shown in FIG. 4.

The control logic 251 can assume a number of configurations, one of which is shown in FIG. 8. The twelve output lines 301 correspond to the output lines from the 12-bit latch circuit 231 representative of the demultiplexed key information for the notes of the octave of the keyer shown in FIG. 4. The notes of the octave which are represented by the different output leads 301 are indicated along the left-hand side of the horizontal lead 301 in FIG. 8. Each of the leads 301 are connected to an input of a different corresponding OR gate 311 through 322, respectively. A second set of inputs to the keyer scanner circuit 234 is applied to each of the OR gates 311 to 322 from twelve corresponding enabling leads T-1 through T-12, respectively. The leads T-1 through T-12 have a negative enabling pulse supplied to them sequentially at the frequency of F scan/12. Typically, this may be accomplished by a twelve-stage ring counter (not shown) which is driven at the F scan rate by the pulses appearing on the terminal 112 (FIG. 4) to cause continued sequential enabling of the twelve output leads T-1 through T-12 of the ring counter.

Any time a negative pulse appears on one of the enabling leads T-1 to T-12 for one of the OR gates 311 through 322, simultaneously with the appearance of a negative signal on the key switch input lead 301 for the same OR gate, the output of that OR gate is negative. For all other combinations of inputs on the two input terminals of the OR gates 311 to 322, the outputs of the gates are positive.

The outputs of all of the OR gates 311 through 322 are connected to corresponding inputs of an output NAND gate 310 which produces a positive output pulse any time any one of the inputs to it are negative. Different types of coincidence gates could be employed for the gates 311 through 322 and 310, so long as the output result uniquely identifies the condition of the signal on one of the key switch input leads 301 in time coincidence with the scanning signals on the scanning input leads T-1 and T-12.

The output 304 from the NAND gate 310 indicates a key up if during the corresponding time slot it is at logic zero and a key down if during the corresponding time slot it is at logic one. This signal is inverted by an inverter 306 and is connected to an AND gate 309 by a line 323. Once each scan period, f attack 253 is shifted into a two-stage shift register 307, 308. When f attack is at logic one at the beginning of one scan and logic zero at the beginning of the next scan frame, and AND gate 309 is enabled, permitting an output line 277 to become logic one if the line 323 also is at logic one and to become logic zero if the line 323 is at logic zero.

Similarly a line 304 is connected to an AND gate 305 directly from the output of the NAND gate 310. F decay is shifted into a two-stage shift register 302, 303, and the line 324 becomes logic one if f decay is at logic one at the beginning of one scan and logic zero at the beginning of the next scan frame. This condition enables the AND gate 305 permitting the output line 324 to become logic one if line 304 is at logic one and to become logic zero if line 304 is at logic zero.

These inputs to the attack/sustain code logic 240, coupled with the scanner inputs and the sampled outputs from the attenuator matrix on the leads 247 control the operation or the write buffer 243 to control the digital attenuator maxtrix 236 for each of the tone signal inputs.

Referring now to FIG. 5, there is shown a detailed circuit diagram of a configuration which can be used for the memory cells of the digital attenuator matrix 236 shown in block form in FIG. 4. Three cells are shown in FIG. 5, each enclosed within dotted lines. Each of these cells corresponds to one of the rectangles of the attenuator matrix circuit 236. Each tone is applied to one end of a lead 238 which includes a resistor 257 in each of the seven cells connected in series to form the attenuator network for each of the tone signal input leads 238. Each of the resistors 257 is shunted by a field-effect transistor 259, the conductivity of which is controlled by a field-effect transistor switch 260. The field-effect transistor 259 also comprises a memory, indicated by the capacitor shown in dotted lines connected between the gate of the transistor 259 and ground. The capacitor is shown in dotted lines because it constitutes the gate capacitance of the field-effect transistor 259 and is not an additional component.

If an output from the keyer scanner circuit 234 is applied to the horizontal lead 261 for a particular key, the input state on lead 244 from the write buffer circuit 243 is enabled to pass through FET switch 260 to initiate or refresh the charge stored on the gate capacitance of transistor 259 and to either turn on or off the transistor 259 dependent on the charge present on its gate. This gate charge lasts long enough to maintain transistor 259 conductive until the next scanning cycle on the lead 261 causes a reapplication of input signal 244 through the FET switch 260 to the gate and gate storage capacitance of the transistor 259. By controlling the signals on the output leads 244 from the write buffer circuit 243 in conjunction with the output signals from the keyer scanner 234, the transistors 259 in the attenuator network are rendered conductive and nonconductive in various patterns to produce the desired attack, sustain, and decay waveforms needed to produce the desired tonal effects from the keyer.

The operated condition of each of the transistors 259 is sensed by an output or read FET switch 263 in each of the cells which senses the charge on the gate capacitance of transistor 259 and transfers it to the read or sense line 247 to control the attack/decay code logic of the circuit 240 for modifying the signals applied to the leads 244 in accordance with the desired state for each of the different attenuator networks.

FIG. 6 shows another version of the cells which can be used in the attenuator matrix 236. This version is essentially the same as the circuit of FIG. 5, but it uses two field-effect transistors per stage instead of three. The one FET switch and bus is removed and the other FET switch and bus is used for both reading and writing. In the circuit of FIG. 6, the read and write buses 244 and 247 are now combined in a single read/write bus 265 which is of the type commonly employed in LSI RAM circuits using a single FET memory cell. The operation of the memory cells of the circuit of FIG. 6, however, is the same as the operation described for FIG. 5, with the second FET transistor 266 performing the combined functions of FET switches 260 and 263 in a conventional manner.

Figure 7:
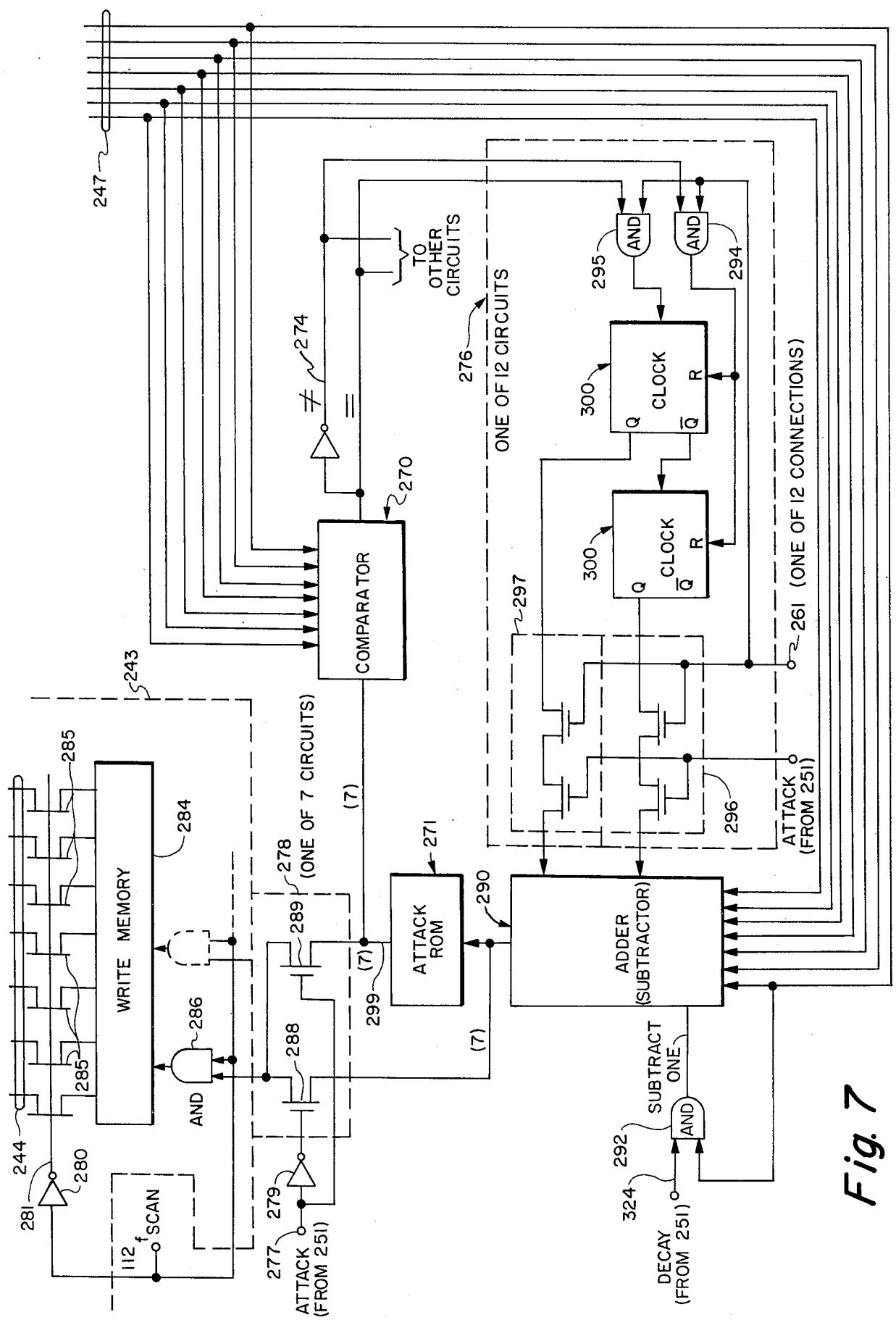
FIG. 7 illustrates details of a portion of the circuit shown in FIG. 4.

FIG. 7 shows additional details of the attack/decay code logic circuit 240 of FIG. 4. The function of the circuit of FIG. 7 is to control the attack, sustain and decay characteristics of the tone signals applied to each of the tone signal input leads 238 in response to the "opening" and "closing" of the keys represented by the outputs of the keyer scanner circuit 234 of FIG. 4. The manner in which this is accomplished is disclosed for a single key in copending application No. 496,943, and the circuitry of FIG. 7 shows the manner in which that logic is expanded to control the twelve keyers of an octave in a time-division multiplex mode of operation.

To operate in this manner, it is necessary to continually sample and update the charge on the gate capacitance of the transistors 259 in the attenuator networks 236. When control logic 251 disables the attack line to the attack/decay code logic 240, FET switch networks 296 and 297 disconnect a counter 300 from an adder 290 in a control circuit 276. FET switches 289 in each of seven circuits 279 are disabled and FET switches 288 are enabled via an inverter 279. This permits the information on the seven output lines (only one is shown) of the adder 290 to pass through the corresponding FET switches 288 and through AND gates 286 when the read line 282 is activated.

Line 112 from f scan determines if the keyer is writing or reading information into and from the attenuator matrix 236. During the first half of each f scan period, information is stored temporarily in write memory 284 by means of AND gates 286 in circuit 243. When the second half of f scan period occurs, the input AND gates 286 to the write memory 284 are inhibited and the FET switches 285 connect the write memory to write the buses 244.

If the "subtract one" line is enabled (as occurs during the decay mode for "key open"), the adder 290 becomes a subtractor and subtracts one from the value entering the adder 290 via the read lines 247. Thus, each time a decay pulse is applied to the gate 292 from the lead 324, the value stored by the gate capacitance of transistors 259 is decremented by one and stored back on the gate capacitors via the FET switches 288, AND gates 286, write memory 284, the FET switches 285, write buses 244, and the FET switches 260. This changed information to the attenuator matrix 236 on the leads 244 creates the desired decay waveform of the tone represented by the key which has been opened, until the point is reached that full attenuation of that tone representative of the full desired decay is obtained. This condition, is sensed when the read line from the off attenuator cell in matrix 236 inhibits AND gate 292 causing the subtract one line to go low, preventing any additional decay pulses from entering the subtractor 290.

Whenever a "key closed" or attack condition occurs, FET switch networks 296 and 297 are enabled, permitting the counter 300 in circuit 276 to be connected to the adder 290. The FET switches 288 are disabled and the FET switches 289 are enabled in the circuits 278. This disconnects the output of the adder 290 from the write memory 284 and connects the attack ROM 271 to the write memory 284 via the FET switches 289 and the AND gates 286. The attack ROM 271 is basically a "look up" table to determine the next attenuation level of the keyer. This can be a complex pattern which does not necessarily change the previous state by the same db level from state-to-state. As a result, for each attack pulse that occurs, the previous attenuation state can remain, or it can be one or several increments different in level depending upon the characteristic waveform desired. In the attack mode of operation, the previous attenuation step read on the leads 247 is applied to the adder 290 where the previous value is summed with the output of the circuit 276. The resultant value addresses the attack ROM 271 and the next attack db level is stored at this address in the attack ROM 271. This value is supplied on the seven outputs of the attack ROM 271 on the lines 299 through the FET switches 289 in the circuit 278, through the AND gates 286 into the write memory 284, then through the FET switches 285, onto the write buses 244, through the FET switches 260 and then onto the gate storage capacitance of transistors 259.

Since it is possible for the state of the attack ROM 271 to remain the same as the previous state when it is addressed during a desired attack mode of operation, it would be possible to lock the system up into some level of pre-established attenuation for a key even though the attack sequence was not finished. This would occur whenever the comparator 270 indicated the lines 247 were in agreement with the output of the attack ROM 271. This would be similar to an infinite loop in a computer program where the system given one state would look up a new state (the same state) and go to this new state, on and on without ever completing the attack sequence from the ROM 271. To prevent this, the control circuits 276 are added which includes the two-bit counter stage 300 for each associated key.

Each time the state from the attack ROM on the leads 299 and the previous state on the leads 247 are matched or equal (as determined by the comparator 270), the counter 300 is incremented by a count of one, by the passage of a pulse through the AND gate 295. The counter 300 output then is applied to the adder 290 via the FET switch networks 296 and 297 to increment the addressing of the ROM 271 by incrementing the adder/subtractor circuit 290 by an additional count. The counter 300 is capable of adding zero, one, two or three to change the state of the adder/subtractor counter circuit 290 by these increments whenever the present and previous state of the ROM 271 are the same.

It should be noted that the control circuit 276 is only effective when the comparator output indicates that the two sets of inputs to it are equal. When the sets of inputs are unequal, the AND gate 294 passes a pulse from lead 274 indicating non-equality to reset the counter 300 to zero. The counter remains in this state, and zero is added to adder 290 as long as the inputs to the comparator 270 on the leads 247 and the output of the ROM 271 do not match. Once the attack sequence is completed, no further changes (increments) can take place from the ROM 271 and the system maintains operation for the time slot having the "key closed" condition as a minimum attenuation, "sustain" mode of operation (see FIG. 3).

If the decay line also is disabled (as occurs for "key closed"), the subtract one line at the output of an AND gate 292 is also disabled since the AND gate 292 is disabled. Since the adder 290 adds or subtracts nothing from the value read on the read lines 247 from the attenuator matrix 236, this same value is reread into the gate capacitance of transistors 259 to refresh the charge once each cycle. This is the sustain mode of operation of the circuit.

I claim:

1. A keying system for shaping tone signals in an electronic musical instrument in which key operation information is digitally multiplexed data, said system including in combination:
   latching circuit means coupled to receive said multiplexed data and having a predetermined number of stages, said latching circuit means responsive to the application of a strobe pulse to each stage thereof to store in such stage the data received thereby at the time of application of such strobe pulse;
   means for applying strobe pulses to the stages of said latching circuit means;
   an attenuator matrix including a plurality of variable attenuator networks corresponding to the number of stages of said latching circuit means;
   scanning circuit means coupled with the outputs of each stage of said latching circuit means for sequentially producing signals representative of the state of the data stored in each stage of said latching circuit means;
   a tone signal input terminal for receiving tone input signals coupled with each variable attenuator network;
   a tone signal output terminal coupled with each variable attenuator network for supplying tone signals therefrom; and
   control circuit means coupled with said scanning circuit means and with said attenuator matrix for controlling the operation of each of said variable attenuator networks according to the output signals from said scanning circuit means.

2. The combination according to claim 1 wherein said control circuit means includes electronic memory means coupled to sense the state of operation of said attenuator networks for controlling the next attenuation state thereof in response to such sensed state and the output signals from said scanning circuit means.

3. The combination according to claim 1 further including coupling circuit means coupled with said variable attenuator networks and with said control circuit means whereby said control circuit means establishes the variable attenuation of each of said variable attenuator networks in accordance with signals applied thereto from said scanning circuit means and from said coupling circuit means.

4. The combination according to claim 1 wherein said scanning circuit means samples the outputs of said latching circuit means to produce said signals representative of the state of the data in each stage of said latching circuit means in a predetermined sequence at a frequency which is in excess of the frequency of the strobe pulses by an amount sufficient to sample all of said latching circuit means outputs between successive strobe pulses.

5. The combination according to claim 1 wherein each of said plurality of variable attenuator networks comprises memory circuit means for retaining the state of operation of such attenuator network between the application of each signal thereto from said scanning circuit means.

6. The combination according to claim 1 wherein said control circuit means further includes means coupled with the output of said scanning circuit means and with clock pulse generating means for controlling the attack and decay waveforms of said variable attenuator networks.

7. The combination according to claim 6 further including means for supplying attack and decay clock pulses and wherein said control circuit means for comparing the state of the outputs of each of said attenuator networks with the state of the input signals supplied thereto from said control circuit means for establishing the next state of the inputs to such attenuator networks in accordance with attack and decay pulses.

8. The combination according to claim 7 wherein said control circuit means includes means for terminating attack and decay attenuation variations of each of said variable attenuator networks upon the attainment of a predetermined state thereof.

9. The combination according to claim 1 wherein each of said variable attenuator networks comprises a voltage divider network coupled between said tone signal input terminal and said tone signal output terminal therefor and having a plurality of resistor elements and a like plurality of switch elements, each switch connected in parallel across a different one of said resistor elements for effectively varying the signal attenuation between said tone signal input terminal and said tone signal output terminal in accordance with the state of operation of said switch elements; and said control circuit means and said scanning circuit means are coupled in circuit with said switch elements to control the state of operation thereof.

10. The combination according to claim 9 wherein said switch elements comprise MOS transistors and said attenuator networks further include storage means for maintaining the state of operation thereof for a predetermined time period and further include means for changing the state of operation thereof in response to signals supplied thereto from said scanning circuit means and said control circuit means.

11. The combination according to claim 1 wherein the kay operational information is digitally multiplexed in a serial data stream, and said strobe pulses are supplied in synchronism with the frequency of said serial data stream.

12. The combination according to claim 11 further including shift register means having a plurality of stages equal to the number of stages of said latching circuit means and coupled to receive said multiplexed serial data stream; wherein each stage of said latching circuit means has an input coupled with an output of a different stage of said shift register means, and wherein said strobe pulses are applied simultaneously to all of the stages of said latching circuit means to store therein the data appearing in said shift register stages at the time of application of such strobe pulses, and said means for applying strobe pulses to the latching circuit means applies such pulses at a frequency which is a predetermined fraction of the frequency of the shift pulses and in synchronism therewith.

13. The combination according to claim 12 wherein said shift register means and said latching circuit means each have a number of stages equal to the number of tones in a musical octave.

* * * * *